(12) United States Patent
Seo et al.

(10) Patent No.: US 7,213,112 B2
(45) Date of Patent: May 1, 2007

(54) MEDIA PROCESSING DEVICE USING AN EXTERNAL STORAGE DEVICE

(75) Inventors: Min-Ho Seo, Seoul (KR); Yong-Kwon Lee, Seoul (KR)

(73) Assignee: Telechips Inc., Seoul (KR)

( * ) Notice: Subject to any disclaimer, the term of this patent is extended or adjusted under 35 U.S.C. 154(b) by 227 days.

(21) Appl. No.: 10/629,565

(22) Filed: Jul. 30, 2003

(65) Prior Publication Data
US 2005/0038965 A1    Feb. 17, 2005

(30) Foreign Application Priority Data
Apr. 4, 2003    (KR)    ............... 10-2003-0021307

(51) Int. Cl.
*G06F 13/10* (2006.01)
(52) U.S. Cl. .................................. 711/154
(58) Field of Classification Search ........... 704/200; 713/300; 717/127; 725/75; 348/240; 375/240; 381/334; 711/154
See application file for complete search history.

(56) References Cited

U.S. PATENT DOCUMENTS

| | | | |
|---|---|---|---|
| 5,867,712 A * | 2/1999 | Shaw et al. ............... | 717/127 |
| 6,151,262 A | 11/2000 | Haroun et al. | |
| 6,332,175 B1 | 12/2001 | Birrell et al. | |
| 6,339,814 B1 | 1/2002 | Iida | |
| 6,553,410 B2 * | 4/2003 | Kikinis .................. | 709/218 |
| 6,629,000 B1 | 9/2003 | Moon et al. | |
| 6,647,499 B1 * | 11/2003 | Morcom ................. | 713/300 |
| 2001/0003542 A1 * | 6/2001 | Kita ....................... | 381/334 |
| 2001/0004397 A1 * | 6/2001 | Kita et al. .............. | 381/334 |
| 2001/0032071 A1 * | 10/2001 | Burchard et al. ...... | 704/200.1 |
| 2002/0015448 A1 * | 2/2002 | Honjo .................... | 375/240.25 |
| 2002/0059614 A1 * | 5/2002 | Lipsanen et al. ....... | 725/75 |

(Continued)

FOREIGN PATENT DOCUMENTS

EP    1043729    10/2000

(Continued)

OTHER PUBLICATIONS

English Language Translationn of Korean Appln. No. U20-290852.

(Continued)

*Primary Examiner*—Pierre Bataille
*Assistant Examiner*—Paul Schlie
(74) *Attorney, Agent, or Firm*—Greenblum & Bernstein, P.L.C.

(57) ABSTRACT

A media processing device uses an external storage device. The media processing device includes a storage device access module, an information source, a program memory, a system memory, a signal processor, a user interface and a system controller. The system controller accesses the external storage device, reads file information, and constructs contents to be displayed. When the system controller receives a command to select a media file, the system controller accesses the external storage device, searches for the selected media file, reads data of the searched media file, copies the read data, and provides the copied data to be decoded. When the system controller receives a commend to encode a signal, the system controller controls the signal processor to encode the input signal into media data, constructs a media file from the encoded media data, positions the media file, and copies the constructed media file when the external storage device is accessible through the storage device access module.

4 Claims, 3 Drawing Sheets

U.S. PATENT DOCUMENTS

| | | | |
|---|---|---|---|
| 2002/0063783 A1* | 5/2002 | Kurase | 348/232 |
| 2002/0154900 A1 | 10/2002 | Shimada | |
| 2003/0019942 A1* | 1/2003 | Blossom | 235/492 |
| 2003/0028690 A1 | 2/2003 | Appleby-Alis et al. | |

FOREIGN PATENT DOCUMENTS

| | | |
|---|---|---|
| EP | 1081699 | 3/2001 |
| EP | 1260929 | 11/2002 |
| JP | 2002-245719 | 8/2002 |
| KR | 2000-58017 | 9/2000 |
| KR | 10-287366 | 4/2001 |
| KR | 2001-30221 | 4/2001 |
| KR | 2001036156 A * | 5/2001 |
| KR | 10-293158 | 6/2001 |
| KR | 2002-1705 | 1/2002 |
| KR | 20290852 | 10/2002 |
| WO | 00/ 67261 | 11/2000 |
| WO | 01/86652 | 11/2001 |
| WO | 02/ 49032 | 6/2002 |
| WO | 03/025932 | 3/2003 |

OTHER PUBLICATIONS

English Language Abstract of JP Korean 10-293158.
English Language Abstract of JP Korean 10-287366.
English Language Abstract of JP Korean 2001-30221.
English Language Abstract of JP Korean 2002-1705.
English Language Abstract of JP Korean 2000-58017.
English Language Abstract of JP 2002-245719.

* cited by examiner

MEDIA PROCESSING DEVICE USING AN EXTERNAL STORAGE DEVICE

BACKGROUND OF THE INVENTION

1. Field of the Invention

The present invention relates to a media processing device, which accesses an external storage device, reads and reproduces media files stored in the external storage device, and stores media files produced by itself through an encoding process in the external storage device, thus enabling the reproduction and storage of the media files without being provided therein with a storage module for storing the media files.

2. Description of the Related Art

Currently, media processing devices for reproducing and storing media files, such as an MPEG-1 Audio Layer-3 (MP3) player and a voice recorder, have been widely used. FIG. 1 is a diagram schematically showing the construction of a conventional media processing device 100. The conventional media processing device 100 is equipped therein with a non-volatile storage module 140, such as flash memory, and, accordingly, is capable of storing media files received from a host device 180 therein. Additionally, when a command to reproduce a media file is input from a user to the conventional media processing device 100 through a user interface module 120, the conventional media processing device 100 reads a media file from the storage device 140 and transmits the data of the media file to a signal processing module 150 so that the data of the media file are encoded according to a certain signal processing method, such as an MP3 encoding method.

For the purpose of the above-described transmission and reception of the media file, the host device 180 and the media processing device 100 are each provided with a transmission medium access function. FIG. 1 illustrates the case where a Universal Serial Bus (USB) transmission medium is used, as an example. In USB technology, when two devices are connected to each other through a USB transmission medium, one device performing a master function is referred to as a USB host while the other device performing a slave function is referred to as a USB device. In the case where the media processing device 100 receives a media file from the host device 180 as shown in FIG. 1, the host device 180 corresponds to the USB host and the media processing device 100 corresponds to the USB device. For this purpose, the host device 180 includes a USB host module 190 and the media processing device 190 includes a USB device module 130.

An Institute of Electrical and Electronics Engineers (IEEE) 1394 transmission medium and a wireless Local Area Network (LAN) can be used as the transmission medium for that purpose, besides the USB transmission medium. As for the connection between the two devices, the devices may be connected to each other through a cable, may be provided with connection ports for the connection therebetween, or may be wirelessly connected to each other through a wireless medium. In the case where IEEE 1394 technology or wireless LAN is used, a different scheme other than the above-described host-device scheme can be employed. For example, in the case of IEEE 1394 technology, a peer-to-peer scheme other than the master-slave scheme is used, and the host device 180 corresponds to a Serial Bus Protocol 2 (SBP2) initiator and the media processing device 100 corresponds to a SBP2 target according to SBP2 that is a higher-rank management protocol. For example, i-Pod of Apple Computer, Inc. is a typical MP3 player utilizing an IEEE 1394 transmission medium. Meanwhile, in general digital transmission media including a USB transmission medium and an IEEE 1394 transmission media, the host device 180 may be generally modeled on a controller and the media processing device 100 may be generally modeled on a target.

Three issues regarding the conventional media processing device 100 are cost reduction and the miniaturization and weight of a product. The storage device 140 would be a great hindrance to address these issues. Further, with respect to the storage capacity of the storage device 140, there is another problem in which user demand for upgrading storage capacity is raised because storage capacity becomes relatively insufficient when one or two years elapse after the products of the storage device 140 have been marketed. In the meantime, external storage media for supporting high performance digital transmission media, such as a USB transmission medium or an IEEE 1394 transmission medium, are popularized, but are problematic in that they are of questionable utility.

SUMMARY OF THE INVENTION

In order to accomplish the above object, the present invention provides a media processing device using an external storage device, including a storage device access module for accessing the external storage device through a certain transmission medium and providing an access to the external storage device; an information sourcing module for sourcing an input signal; a program memory module for storing a system program for system control of the media processing device; a system memory module for providing memory space for operation of the media processing device; a signal processing module for decoding media data according to a first signal processing method and encoding the input signal into media data according to a second signal processing method; a user interface module for providing an interface to a user of the media processing device; and a system control module for controlling the storage device access module, the signal processing module and the user interface module according to the system program; wherein the system control module accesses the external storage device through the storage device access module, reads file information of one or more media files, and constructs contents to be displayed on the user interface module based upon the read file information; wherein, when the system control module receives command to select one of the two or more media files through the user interface module, the system control module accesses the external storage device through the storage device access module, searches for the selected media file, reads data of the searched media file, copies the read data to the system memory module, and provides the copied data to the signal processing module so that the provided data are decoded according to the first signal processing method; wherein, when the system control module receives command to encode a signal through the user interface module, the system control module transmits the input signal provided from the information sourcing module to the signal processing module so that the transmitted input signal is encoded to media data according to the second signal processing method, constructs a media file from the encoded media data, positions the media file on the system memory module, copies the constructed media file to the external storage device if the external storage device is currently accessible through the storage device access module, and waits until the external storage device becomes accessible and, then, copies the constructed media file to the external storage device if the external storage device is not currently accessible.

In order to accomplish the above object, the present invention provides a media processing device using an external storage device, including a storage device access module for accessing the external storage device through a certain transmission medium and providing an access to the external storage device; a boot code memory module for storing a boot code for system booting of the media processing device; a system memory module for providing memory space for operation of the media processing device; a signal processing module for decoding media data according to a first signal processing method and decoding the input signal into the media data according to a second signal processing method; a user interface module for providing an interface to a user of the media processing device; and a system control module for controlling the storage device access module, the signal processing module and the user interface module; wherein the system control module loads a system program for performing system control of the media processing device from the external storage device to the system memory module through the storage device access module in an early operation mode in which the media processing device is operated according to the boot code, and, thereafter, is operated according to the loaded system program; wherein the system control module accesses the external storage device through the storage device access module, reads file information of one or more media files stored in the external storage device, and constructs contents to be displayed on the user interface module based upon the read file information; wherein, when the system control module receives a command to select one of the two or more media files through the user interface module, the system control module accesses the external storage device through the storage device access module, copies data of the selected media file to the system memory module, and provides the copied data of the selected media file to the signal processing module so that the provided data of the selected media file are decoded according to the first signal processing method.

In order to accomplish the above object, the present invention provides a media processing device using an external storage device, including a storage device access module for accessing the external storage device through a certain transmission medium and providing an access to the external storage device; a program memory module for storing a system program for system control of the media processing device; a system memory module for providing memory space for operation of the media processing device; a signal processing module for decoding media data according to a first signal processing method; a user interface module for providing an interface to a user of the media processing device; and a system control module for controlling the storage device access module, the signal processing module and the user interface module; wherein the system control module accesses the external storage device through the storage device access module, reads file information of one or more media files, and constructs contents to be displayed on the user interface module based upon the read file information; wherein, when the system control module receives a command to select one of the two or more media files through the user interface module, the system control module accesses the external storage device through the storage device access module, reads data of the selected media file, copies the read data of the selected media file to the system memory module, and provides the copied data of the selected media file to the signal processing module so that the provided data of the selected media file are decoded according to the first signal processing method.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
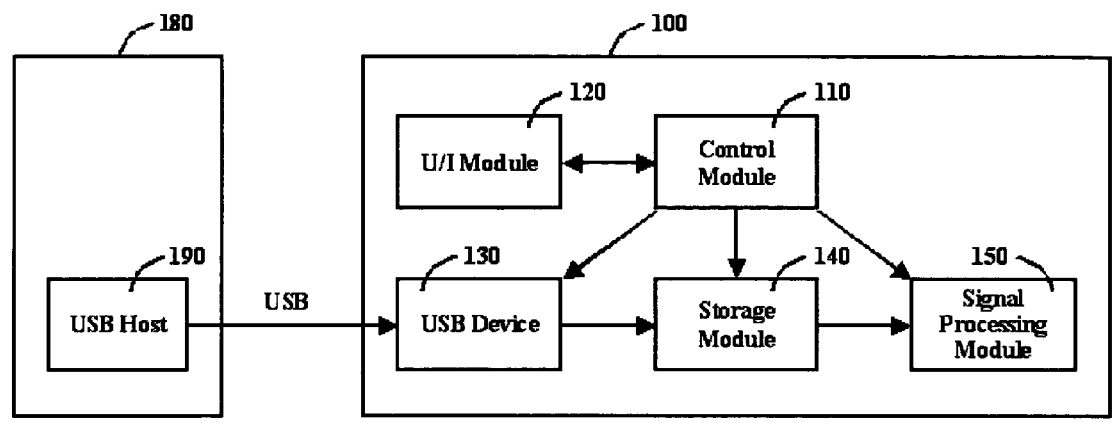
FIG. 1 is a diagram schematically showing the construction of a conventional media processing device.

Reference now should be made to the drawings, in which the same reference numerals are used throughout the different drawings to designate the same or similar components.

Figure 2:
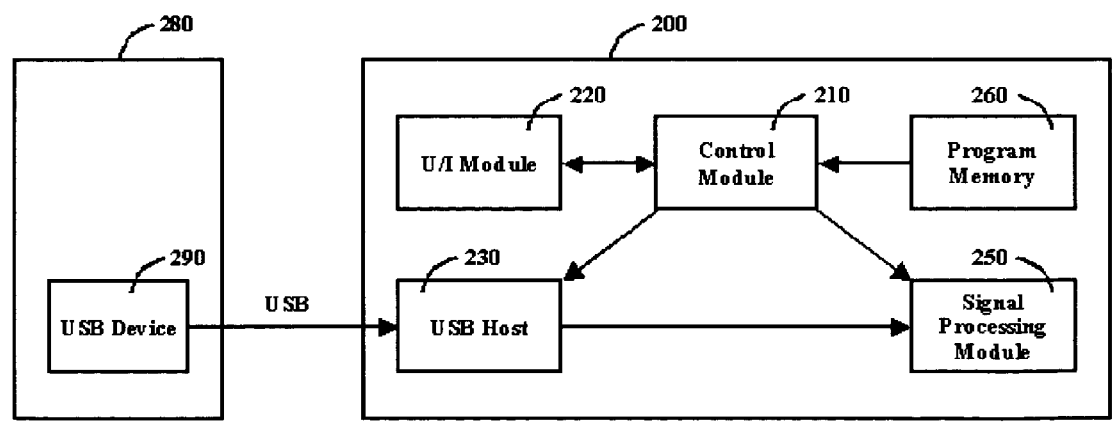
FIG. 2 is a diagram conceptually illustrating the construction in which a media processing device is used to reproduce media files in accordance with an embodiment of the present invention.

FIG. 2 is a diagram conceptually illustrating the construction in which a media processing device 200 is used to reproduce media files in accordance with an embodiment of the present invention. The media processing device 200 is mainly constructed to reproduce media files, and is operated to obtain media files from an external storage device 280 and reproduce the media files. In this embodiment, a USB interface is used as a transmission medium for connecting the media processing device 200 and the external storage device 280. In the present invention, the media processing device 200 functions as a USB host, and is provided therein with a USB host module 230 for this purpose. In contrast, the external storage device 280 functions as a USB device, and is provided therein with a USB device module 290.

In this embodiment, the media processing device 200 includes a User Interface (U/I) module 220 for providing a user interface, and a signal processing module 250 for performing a signal processing operation according to a certain signal processing method, which is basically the same as the conventional media processing device 100. Meanwhile, the media processing device 200 of the present is not provided therein with the conventional storage device 140, but rather with a program memory module 260. The conventional storage device 140 has a capacity of more than tens of MB, basically contains a system program of the media processing device 100, and is provided with space capable of storing media files. In contrast, the program memory module 260 has a capacity of hundreds of KB, and is very different from the conventional storage device 140 in that the program memory module 260 contains only a system program of the media processing device 200 but is not provided with space for storing media files.

Further, in this embodiment, the media processing device 200 is different from the conventional media processing device 100 in that media files are obtained through the USB transmission medium and directly input to the signal processing module 250. That is, the media processing device 200 uses the storage medium of the external storage device 280 like an internal storage medium. By being constructed as described above, the media processing device 200 of the present invention can be sufficiently operated using the smaller capacity, lower cost program memory module 260, through which the implementation of the lower cost, miniaturization and lower weight of the media processing device 200 is enabled. Further, by being constructed as described above, the media processing device 200 of the present invention can make use of the external storage device 280 through the provision of a transmission medium 230 and, therefore, can implement the extension of capacity.

Figure 3:
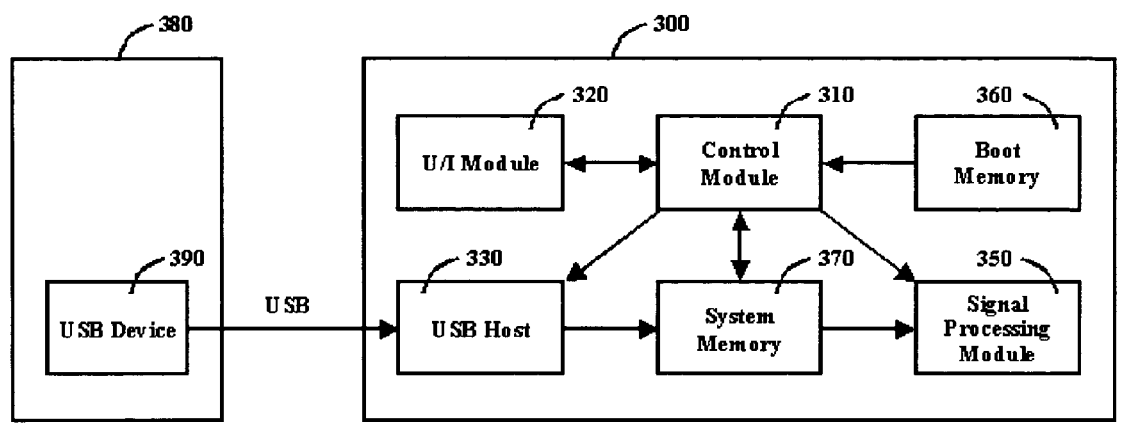
FIG. 3 is a diagram conceptually illustrating the construction in which a media processing device is used to reproduce media files in accordance with another embodiment of the present invention.

FIG. 3 is a diagram conceptually illustrating the construction in which a media processing device 300 is used to reproduce media files in accordance with another embodiment of the present invention. In the embodiment of FIG. 3, the media processing device 300 of this embodiment is mainly constructed to reproduce media files, and is identical with the media processing device 300 of the above-described embodiment in that the media processing device 300 is operated to obtain media files from an external storage device 380 and reproduce the media files. However, the media processing device 300 of this embodiment is different from the media processing device 300 of the above-described embodiment in that the media processing device 300 includes not only a system memory module 370 formed of Dynamic Random Access Memory (DRAM) or Static Random Access Memory (SRAM), but also a boot code memory module 360 for storing system boot code instead of the program memory module 260 for storing a system program.

The boot code memory module 360 is a module for storing boot code for the system booting of the media processing device 300, and has a capacity of tens of KB. The boot code memory module 360 may be implemented together with a system control module 310 in a signal controller chipset. In this embodiment, it is assumed that the system program of the media processing device 200 is stored in the external storage device 380 preferably in a file form. This system program is distributed by the manufacturer of the media processing device 300 preferably via the Internet, and a user can download the system program and store the system program in the external storage device 380 in a file form.

Accordingly, when the media processing device 300 is booted at an initial stage, the media processing device 300 is operated according to the boot code stored in the boot code memory module 360. Thereafter, when the connection of the media processing device 300 to the external storage device 380 is detected through a USB host module 330, the media processing device 300 searches the storage space of the external storage device 380, copies a system program compatible with a model of the media processing device 300 to the system memory module 370 and, thereafter, is operated according to the copied system program. The system program copied as described above preferably remains without being deleted while power is supplied. In this state, when the external storage device 380 without a system program file for the media processing device 300 is connected to the media processing device 300, the copied system program file is preferably copied from the system memory module 370 to the external storage device 380.

When the external storage device 380 is connected to the media processing device 300, the media processing device 300 preferably copies all or part of the file information of media files, such as a file allocation table, various pieces of directory structure information or various pieces of descriptor information, stored in the external storage device 380 to the system memory module 370 in advance. By doing this, the number of times the external storage device 380 is accessed can be reduced, through which the operational speed of the media processing device 300 can be increased and power consumption can be reduced as described later. In the case where the file information has been copied to the system memory module 370 as described above, the file information is preferably referred to from the system memory module 370 thereafter. In this case, when the file of the external storage medium 380 is varied in the operation thereof, a kind of version management is performed by recopying file information from the external storage device 380 or changing the file information of the system memory module 370.

When the media processing device 300 receives a command to select a specific media file from a user through a user interface module 320, the media processing device 300 accesses the external storage device 380, searches the external storage device 380 for the media file, copies the data of the media file to the system memory module 370, reads the data of the media file from the system memory module 370 and provides the data of the media file to a signal processing module 350. By doing this, the number of times the external storage device 380 is accessed can be reduced, through which the operational speed of the media processing device 300 can be increased and power consumption can be reduced as described later. Further, there is a case where one or more media files to be reproduced after a media file being currently reproduced can be previously perceived through various information, such as a meta information file, a user selection input or file order information. In this case, it is possible to implement an operation, in which one or more media files to be produced next are previously copied from the external storage device 380 to the system memory module 810 in the process of signal processing a media file being currently reproduced, as a kind of background operation, through which the operational speed of the media processing device 300 can be improved. However, in this case, the priority of the operation of copying the next media file is preferably set to be lower than that of the operation of signal processing the current media file.

In the meantime, in the case of the utilization of the external storage device 380, power consumption may be a problem. In particular, in the case where the media processing device 300 of the present invention is a portable device, such as a MP3 player, the power consumption may be a serious problem. For example, if the external storage device 380 is not equipped with a separate power source in the case where a USB interface is used, the media processing device 300 should provide a voltage of about 5 V and a current of about 40 mA. This power consumption may impose a great burden on the media processing device 300. Accordingly, the operational mode of a USB host module 330 may be set to an activated mode or an inactivated mode according to the control of a system control module 310. The inactivated mode is preferably constructed that the above-described power supply is not performed. The implementation of such an activated mode is easily enabled using well-known transistor technology. For example, the activated mode can be easily implemented using the tri-state mode of a transistor.

After the USB host module 330 has been constructed as described above, the power consumption of the media processing device 300 can be reduced by setting the operational mode of the USB host module 330 to the inactivated mode while the media processing device 300 does not access the external storage device 380. In this case, if the number of times the media processing device 300 accesses the external storage medium 380 is reduced by the above-described various methods, the power consumption of the media processing device 300 can be reduced.

Figure 4:
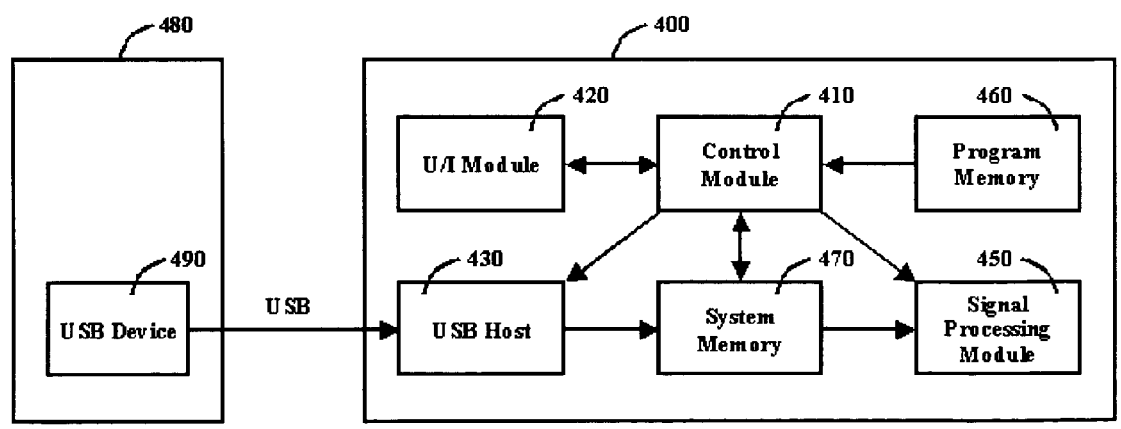
FIG. 4 is a diagram conceptually illustrating the construction in which a media processing device is used to reproduce media files in accordance with still another embodiment of the present invention.

FIG. 4 is a diagram conceptually illustrating the construction in which a media processing device 400 is used to reproduce media files in accordance with still another embodiment of the present invention. Compared to the media processing device 300 of FIG. 3, a media processing device 400 of FIG. 4 does not have the boot code memory module 360 but has a program memory module 460. That is, since a system program for performing the system control of the media processing device 400 is embedded in the program memory module 460, it is not necessary to copy the system program from an external storage device 480 as described with reference to FIG. 3. The other details are substantially the same as those of the embodiment of the media processing device 300.

Figure 5:
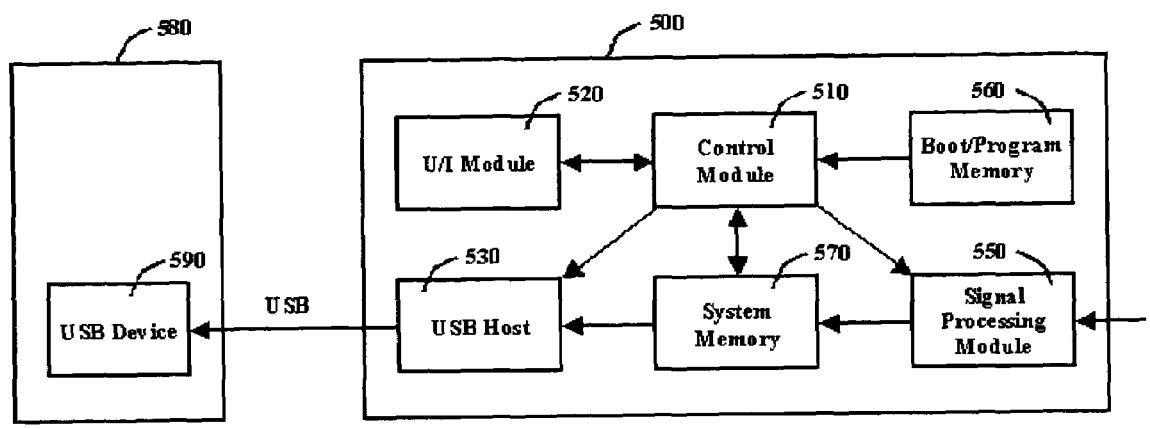
FIG. 5 is a diagram conceptually illustrating the construction in which a media processing device is used to store media in accordance with an embodiment of the present invention.

FIG. 5 is a diagram conceptually illustrating the construction in which a media processing device 500 is used to store media in accordance with an embodiment of the present invention. In the media processing device 500 of FIG. 5, a signal processing module 550 performs an encoding operation according to a certain signal processing method, such as a MP3 signal processing method. That is, the media processing device 500 encodes an input signal received from a certain information source according to the certain signal processing method, outputs media data, and arranges the encoded media data in a certain file format to construct a media file.

In this embodiment, the media processing device 500 positions the media file constructed as described above on a system memory module 570. Thereafter, if an external storage device 580 becomes accessible, the media file is copied to the external storage device 580 through a USB host module 530. In contrast, if the external storage device 580 is accessible at the time when the media file is constructed, the media file is immediately copied from the system memory module 570 to the external storage device 580. However, this operation is only an embodiment of the present invention, so that the present invention is not limited to this embodiment. That is, the media processing device 200 not equipped with the system memory module, or media processing device 300 or 400 equipped with the system memory module having insufficient capacity performs the encoding of the media data only if the external storage device is accessible, and may be operated to construct a media file in the external storage device 580 without the intervention of the system memory module.

The above-described information source may exist in various forms. For example, the information source may be a module that receives signals from the outside and provides the signals as they are or processed signals to the inside. Further, the information source may be a module that generates signals from an external environment and provides the signals, like a microphone. In particular, the information source may be modeled on an operation in which a signal is generated in the media processing device 500 by performing a function, such as contents reproduction, in the media processing device 500. In general, the information source is understood to be a module that provides signals in an analog format or digital format to the inside of the media processing device 500.

Figure 6:
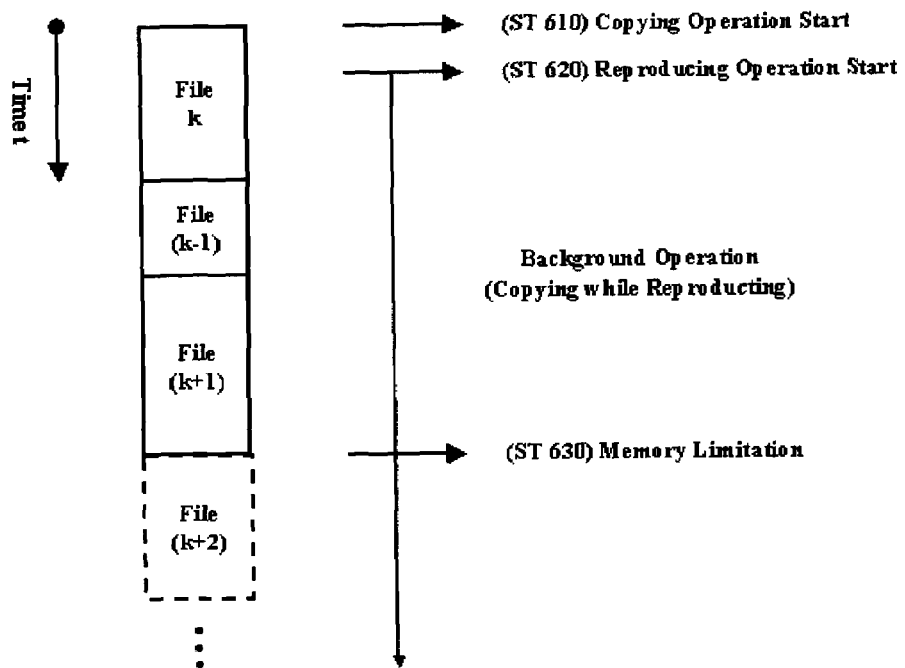
FIG. 6 is a diagram showing an embodiment of a timing relationship between an operation of copying media data to the system memory module and an operation of reproducing a media file in the media processing device of the present invention.

FIG. 6 is a diagram showing an embodiment of a timing relationship between an operation of copying media data to the system memory module and an operation of reproducing a media file in the media processing device of the present invention. Referring to FIGS. 3 and 4, in the above-described media processing devices 300 and 400, when a user selects a specific media file, the media processing device 300 or 400 accesses the external storage device 380 or 480, searches for the corresponding media file, copies the data of searched media file to the system memory 370 or 470, and transmits the data of the searched media files from the system memory 370 or 470 to the signal processing module 350 or 450. FIG. 6 illustrates the case where the user selects a specific media file k. As described above, the media processing device 300 or 400 copies the media file k to the system memory 370 or 470 at step ST 610 and, thereafter, reproduces the copied media file k at step ST 620.

In this case, it is possible to start the reproducing operation after copying all the selected media file k to the system memory 370 or 470. However, in order to reduce a user's waiting time, it is preferable to provide the media data to the signal processing module 350 or 450 and perform a decoding operation even before all of the media file k is copied, when the media data are copied to the system memory 350 or 470 to such an extent that the signal processing module 350 or 450 can perform an encoding operation. FIG. 6 illustrates the case where the operation of reproducing the media file k starts at step ST 620 before the operation of copying the media file k is not completed after the copying operation of the media file k has started at step ST 610. In this case, the operation of copying the media data is performed as a background operation while the reproducing operation is continuously performed.

In a preferred embodiment of the present invention, adjacent media files expected to be reproduced next are copied to the system memories 370 and 470 in advance during the operation of reproducing media files. If the operation of copying the media files is faster than the operation of reproducing the media files, a memory limitation in which media data cannot be further copied to the system memory 370 or 470 may be reached at step ST 630. In this case, the media processing device 400 temporarily stops the operation of copying the media file or reduces the speed of the copying operation. In this sense, a media file k+2 is indicated by dotted lines.

In accordance with the present invention, the media processing device is advantageous in that the internal construction of the media processing device is simplified, thus maximizing the production costs of a product and optimizing the size and weight of the product.

In the present specification, the elements shown in FIGS. 1 to 5 have been distinguished from each other to represent their functions. Accordingly, a plurality of elements may be implemented in a single module, for example, a single controller chipset, or each element may be implemented to be divided into two or more modules.

Further, in the present specification, the above-described embodiments, in which non-volatile storage devices do not exist, are only examples that have been cited to clearly represent the objects and effects of the present invention. Accordingly, according to the implementation of the present invention, there may be a so-called hybrid type, in which the conventional media processing device is combined with the media processing device of the present invention, a non-volatile storage device is provided therein, and the above-described operations are performed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A media processing device, comprising:
    a storage device access module that accesses and provides access to an external storage device through a transmission medium comprising a wireless communications medium, and that provides power to the external storage device during an activated mode but does not provide power to the external storage device during an inactivated mode;
    an information source that provides an input signal;
    a program memory that stores a system program for system control of the media processing device;
    a system memory that provides memory space for operation of the media processing device;
    a signal processor that decodes media data according to a first signal processing method and encodes the input signal into media data according to a second signal processing method;
    a user interface that provides an interface to a user of the media processing device; and
    a system controller that controls the storage device access module, the signal processor and the user interface according to the system program;
    wherein, the system controller initially accesses the external storage device through the storage device access module, reads file information of at least one media file, constructs contents to be displayed on the user interface based upon the read file information, and sets the access mode of the storage device access module to the inactivated mode;
    wherein, when the system controller receives a command to decode at least one media file through the user interface, the system controller sets the access mode of the storage device access module to the activated mode, accesses the external storage device through the storage device access module, searches for the selected media file, reads data of the searched media file, copies the read data to the system memory, provides the copied data to the signal processor so that the provided data are decoded according to the first signal processing method, and sets the access mode of the storage device access module back to the inactivated mode;
    wherein, when the system controller receives a command to encode a signal through the user interface, the system controller controls the signal processor to encode the input signal into media data according to the second signal processing method, constructs a media file from the encoded media data, positions the media file on the system memory, waits until the external storage device is accessible when the external storage device is currently inaccessible through the storage device access module, sets the access mode of the storage device access module to the activated mode, copies the constructed media file to the external storage device, and sets the access mode of the storage device access module back to the inactivated mode, and
    wherein the storage device access module accesses the external storage medium through the wireless communications transmission medium and is operated in a controller mode.

2. The media processing device as set forth in claim 1, wherein the system controller copies another media data from the external storage device to the system memory while causing the copied media data to be decoded according to the first signal processing method by providing the copied media data to the signal processor, a priority of the copying operation being lower than a priority of the decoding operation.

3. The media processing device as set forth in claim 1, wherein the transmission medium further comprises a universal serial bus, and
wherein the storage device access module accesses the external storage medium through the universal serial bus and is operated in a host mode.

4. The media processing device as set forth in claim 1, wherein the transmission medium further comprises an Institute of Electrical and Electronics Engineers 1394 transmission medium, and
wherein the storage device access module accesses the external storage medium through the Institute of Electrical and Electronics Engineers 1394 transmission medium and is operated in a serial bus protocol 2 initiator mode.

* * * * *

UNITED STATES PATENT AND TRADEMARK OFFICE
CERTIFICATE OF CORRECTION

PATENT NO.       : 7,213,112 B2                                        Page 1 of 1
APPLICATION NO.  : 10/629565
DATED            : May 1, 2007
INVENTOR(S)      : M. Seo et al.

It is certified that error appears in the above-identified patent and that said Letters Patent is hereby corrected as shown below:

Cover page, item (57), Abstract, line 12, "commend" should be --command--.

Cover page, item (73), Assignee, "Seoul" should be --Seoul City--.

Cover page, item (56), References Cited, OTHER PUBLICATIONS, line 1, "Translationn" should be --Translation--.

Cover page 2, item (56), References Cited, OTHER PUBLICATIONS, lines 1-5,

"English Language Abstract of JP Korean 10-293158" should be --English Language Abstract of Korean 10-293158--;

"English Language Abstract of JP Korean 10-287366" should be --English Language Abstract of Korean 10-287366--;

"English Language Abstract of JP Korean 2001-30221" should be --English Language Abstract of Korean 2001-30221--;

"English Language Abstract of JP Korean 2002-1705" should be --English Language Abstract of Korean 2002-1705--;

"English Language Abstract of JP Korean 2000-58017" should be --English Language Abstract of Korean 2000-58017--.

Signed and Sealed this

Twenty-fourth Day of June, 2008

JON W. DUDAS
*Director of the United States Patent and Trademark Office*